US006822466B1

(12) United States Patent
Holcombe et al.

(10) Patent No.: US 6,822,466 B1
(45) Date of Patent: Nov. 23, 2004

(54) ALIGNMENT/RETENTION DEVICE FOR CONNECTOR-LESS PROBE

(75) Inventors: Brent A. Holcombe, Colorado Springs, CO (US); Brock J. LaMeres, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/644,365

(22) Filed: Aug. 20, 2003

(51) Int. Cl.[7] .................................................. G01R 1/04
(52) U.S. Cl. ..................... 324/761; 324/754; 324/158.1; 439/289; 439/374
(58) Field of Search ................................. 324/758, 761, 324/754, 158.1, 72.5; 439/482, 700, 289, 374, 378, 362

(56) References Cited

U.S. PATENT DOCUMENTS

| 5,949,244 | A | * | 9/1999 | Miley | 324/762 |
| 6,091,253 | A | * | 7/2000 | Huang | 324/758 |
| 6,497,735 | B2 | * | 12/2002 | Tao | 44/275 |
| 6,529,023 | B2 | * | 3/2003 | Becker et al. | 324/754 |

* cited by examiner

Primary Examiner—Michael Tokar
Assistant Examiner—Jimmy Nguyen

(57) ABSTRACT

An alignment/retention device. The device includes a housing having a first side and an opposing second side. The housing includes an opening which extends from the first side to the second side. Multiple alignment pins are imbedded in the housing and extend external to both the first and second sides. On the first side the alignment pins are capable of insertion into matching holes on an electronic probe, and on the second side the alignment pins are capable of insertion into matching holes on an electronic circuit assembly.

20 Claims, 5 Drawing Sheets

ALIGNMENT/RETENTION DEVICE FOR CONNECTOR-LESS PROBE

BACKGROUND

In the development and manufacture of modern electronic circuits, testing of the circuits, whether it be for design debug, design confirmation, or the troubleshooting of defective circuits, is an indispensable activity. In order to evaluate or debug high-speed digital circuits, accurate measurement and display of signal waveforms and alternating current (AC) characteristics are often desired.

In many instances the measurements are performed by specifically designed probes, which have predefined physical and electrical qualities. The electrical qualities of a probe determine, in part, the response to the AC characteristics, the accuracy of the measurement, and the extent to which the probe detects the signal without detrimentally affecting the operation of the system or circuit being probed. One measure of a probe's intrusiveness is the loading presented by the probe on the circuit. High probe tip capacitance causes circuit loading problems for circuits with fast edge rates. Minimizing the capacitance associated with the probe has been one typical solution for reducing the loading and intrusiveness of the probe.

In this regard, a recent development is a probe system that comprises a semi-rigid support attached to a probing end of a probe. A spring pin and an isolation network are attached to the semi-rigid support. The semi-rigid support permits probing without the use of a mating connector. This so-called connector-less probe can be used to probe printed circuit boards and buses. Such a probe system is described in U.S. patent application Ser. No. 10/373,820, entitled "Connector-Less Probe" filed 25 Feb. 2003 by Brent A. Holcombe et al. which is incorporated herein by reference.

SUMMARY

In representative embodiments, an alignment/retention device is disclosed. The device includes a housing having a first side and an opposing second side. The housing includes an opening which extends from the first side to the second side. Multiple alignment pins are imbedded in the housing and extend external to both the first and second sides. On the first side the alignment pins are capable of insertion into matching holes on the electronic probe, and on the second side the alignment pins are capable of insertion into matching holes on an electronic circuit assembly.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements.

DETAILED DESCRIPTION

Figure 1:
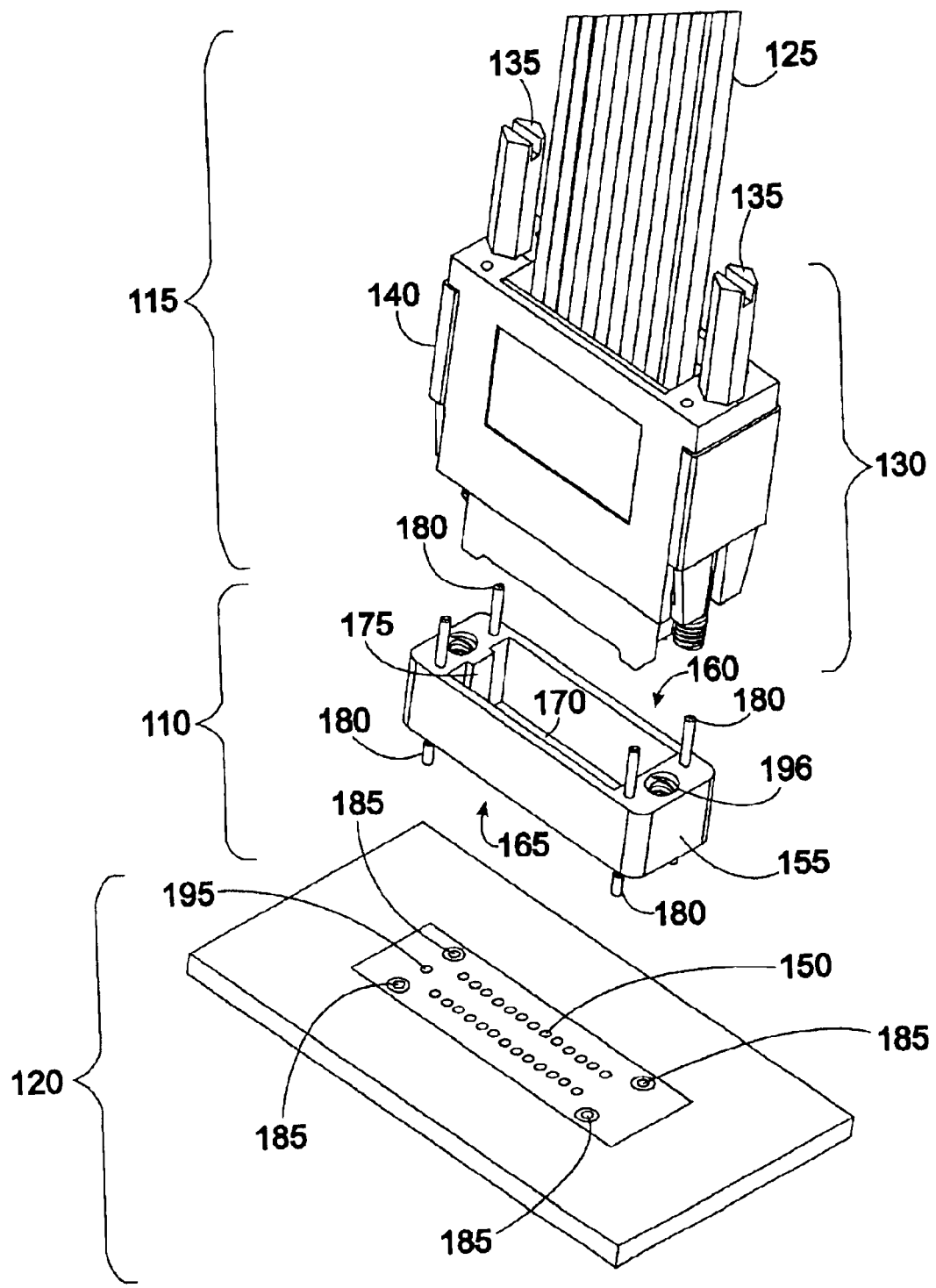
FIG. 1 is a drawing of an exploded, perspective view of a probe system with an alignment/retention device in a representative embodiment.

Various embodiments of an alignment/retention device for a connector-less probe are shown in the drawings for purposes of illustration. These embodiments can be used to obtain hands-free probing or testing of electronic devices and circuits. Such embodiments are especially useful in the electronic test of printed circuit boards, and can be used, for example, with the test probes of an oscilloscope, logic analyzer, or other electronic tester. They provide greater contact stability and alignment for the test points on the item under test. In particular, in conjunction with a connector-less probe they provide a low capacitance, non-destructive method for probing electronic signals on printed circuit boards having a connector-less probe and a related set of test points.

In the following detailed description and in the several figures of the drawings, like elements are identified with like reference numerals.

FIG. 1 is a drawing of an exploded, perspective view of a probe system 100 with an alignment/retention device 110 in a representative embodiment. In FIG. 1, three major components of the probe system 100 are shown. These components are an electronic probe assembly 115, the alignment/retention device 110, and an electronic circuit assembly 120. The alignment/retention device 110 is also referred to herein as the device 110.

In a representative embodiment, the electronic probe assembly 115 comprises a flexible cable 125 which in turn comprises conductive wires that connect typically a test instrument (not shown in the figures) which could be, for example, an oscilloscope, logic analyzer, other electronic tester, other electronic system, or the like to an electronic probe test head 130 which is also referred to herein as electronic probe 130. The electronic probe test head 130 can take various embodiments well known in the art but could involve an attachment mechanism 135 for mechanically attaching the electronic probe test head 130 to a device or circuit which is to be tested or probed. The attachment mechanism 135 could be, for example, one or more screws 135, two of which are shown in FIG. 1. The attachment mechanism 135 attaches to an appropriate mating device 196, also referred to herein as a fastener part 196, in order to securely affix the electronic probe test head 130' to the device/circuit to be probed.

The electronic probe test head 130 further comprises a frame 140 within which at least one probe tip 145 (not shown in FIG. 1) is housed. The probe tips 145 are placed in electrical contact with the device/circuit to be tested in order to electrically connect test points 150 on the device/circuit to be tested with the electronic tester.

The device/circuit to be tested is shown in FIG. 1 as electronic circuit assembly 120 which could be, for example, printed circuit board 120 or the like. The printed circuit board 120 comprises various electronic components (not shown in the figures) at least one of which is attached to a test point 150. Two parallel rows of test points 150 are shown in the embodiment of FIG. 1. However, the number and layout of the test points 150 is implementation dependent.

In order to make a reliable measurement, the probe tips 145 of the electronic probe test head 130 must be accurately aligned to test points 150 on the electronic circuit assembly 120. In addition, this alignment must be mechanically stable for the duration of the test. Embodiments of the alignment/retention device 110 enable accurate alignment of the probe tips 145 of the electronic probe test head 130 to the test points 150 on the electronic circuit assembly 120.

More detailed descriptions of the alignment/retention device 110 will be provided below. As an overview, however, in a representative embodiment, the alignment/retention device 110 comprises a body 155, also referred to herein as housing 155, of material. The housing 155 has a first side 160 and an opposing second side 165, wherein the housing comprises an opening 170 extending from the first side 160 to the second side 165. In alternative, representative embodiments the alignment/retention device 110 further comprises a first key 175, wherein when the first key 175 is aligned with a matching geometry 176 (not shown in the figures) on the electronic probe 130, entry of the electronic probe 130 into the opening 170 is enabled. Otherwise, entry is prevented. In addition, the alignment/retention device 110 further comprises multiple alignment pins 180 which are imbedded in the housing 155 and which extend external to both first and second sides 160, 165 of the housing 155. On the first side 160 the alignment pins 180 are capable of insertion into matching holes (not shown in the figures) on the electronic probe 130, and on the second side the alignment pins 180 are capable of insertion into matching holes 185 on an electronic circuit assembly 120. In FIG. 1, the electronic circuit assembly 120 is shown with four alignment pins 180 placed in a rectangular pattern. However, the number and placement of the alignment pins 180 is implementation dependent. In other embodiments, the alignment/retention device 110 further comprises a second key 190 (see FIGS. 3A and 4A), wherein when the second key 190 is aligned with a matching geometry 195, shown as hole 195 in FIG. 1, on the electronic circuit assembly 120, insertion of the alignment pins 180 into the matching holes 185 on the electronic circuit assembly 120 is enabled. Otherwise such entry is prevented. The second key 190 could be, for example, additional pin 190 imbedded in the housing 155 which extends external to the second side 165. The matching geometry 195 on the electronic circuit assembly 120 is then the hole 195 of FIG. 1 into which the additional pin 190 is capable of insertion.

In alternative embodiments, correct orientation of the alignment/retention device 110 to the pattern of test points 150 on the electronic circuit assembly 120 is obtained by the off-setting of one or more alignment pins 180 from the rectangular pattern shown in the figures. In which case, the additional pin 190 becomes unnecessary for preventing incorrect orientation of the alignment/retention device 110 to the pattern of test points 150.

The alignment/retention device 110 further comprises the optional fastener part 196 which is capable of attaching the electronic probe 130 to the housing 155 of the alignment/retention device 110. In the embodiment of FIG. 1, the fastener part 196 comprises two threaded screw holes 196 into which a screw 135 attached to the electronic probe 130 can be inserted. While two fastener parts 196 (screw holes) are shown in FIG. 1, only one fastener part 196 or more than two are also possible.

Note that in the embodiment of FIG. 1, the axis of the alignment pins 180 is parallel to the axis of the opening 170.

On the second side 165 of the alignment/retention device 10, the alignment pins 180 can be attached to the electronic circuit assembly 120 following their insertion into the electronic circuit assembly 120 matching holes 185. Such attachment can be effected, for example, by soldering the alignment pins 180 into the electronic circuit assembly 120 matching holes 185.

Figure 2:
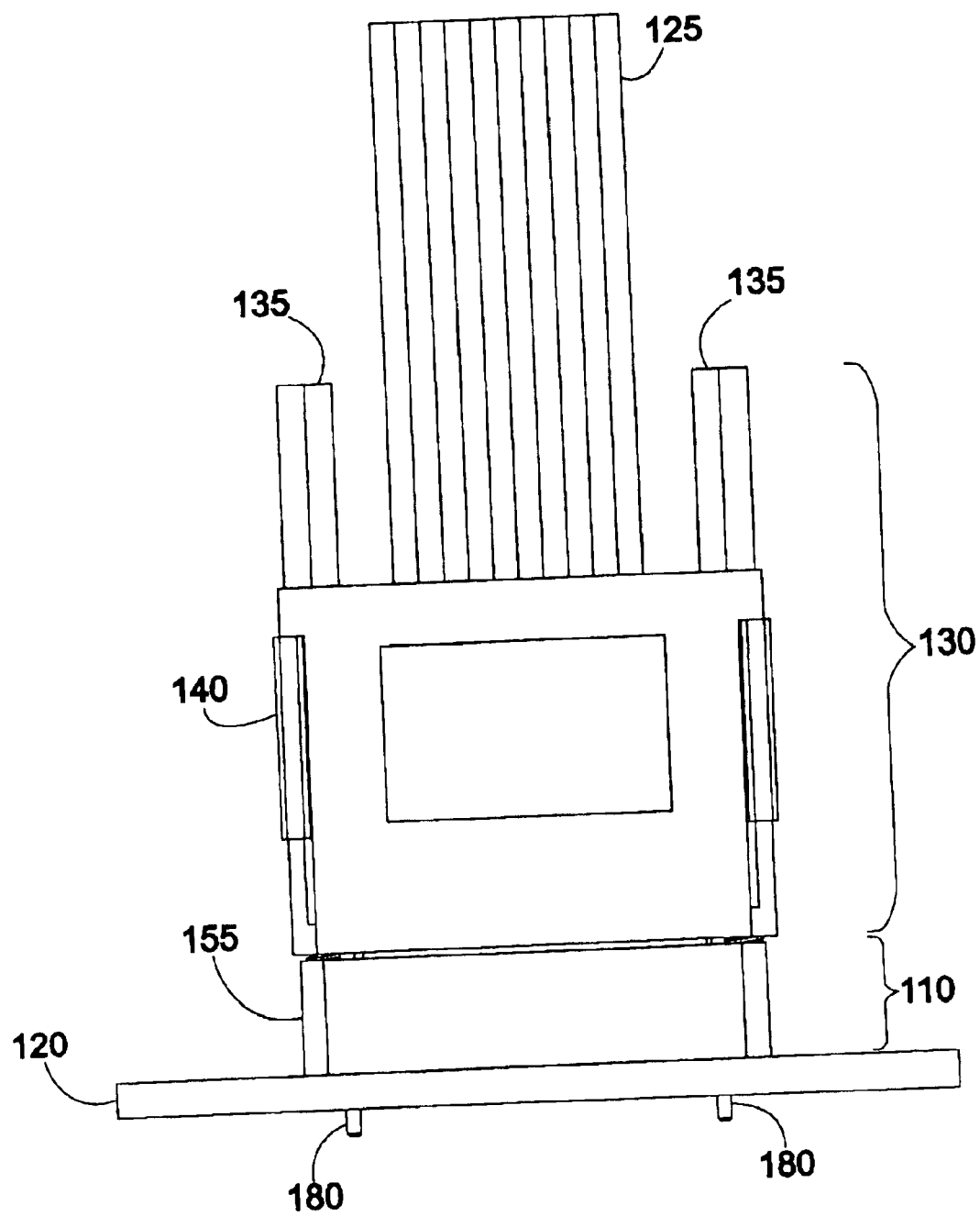
FIG. 2 is a drawing of a side view of the probe system with the probe system of the representative embodiment of FIG. 1.

FIG. 2 is a drawing of a side view of the probe system with the probe system 100 of the representative embodiment of FIG. 1. In FIG. 2, the flexible cable 125 connected to the electronic test system (not shown in the figures) is attached to the electronic probe test head 130 which has frame 140. The electronic probe test head 130 is held fast to the alignment/retention device 110 by means of the two screws 135 which are screwed into the two threaded screw holes 196 (see FIG. 1) in the housing 155 of the alignment/retention device 110. The housing 155 of the alignment/retention device 110 is attached to the electronic circuit assembly 120 (printed circuit board 120) by insertion of the alignment pins 180 into matching holes 185 (see FIG. 1) on the electronic circuit assembly 120. For a permanent, mechanically stable attachment, the alignment pins 180 are solder to metalization surrounding the matching holes 185 on the electronic circuit assembly 120 after they are inserted into the electronic circuit assembly 120.

Figure 3A:
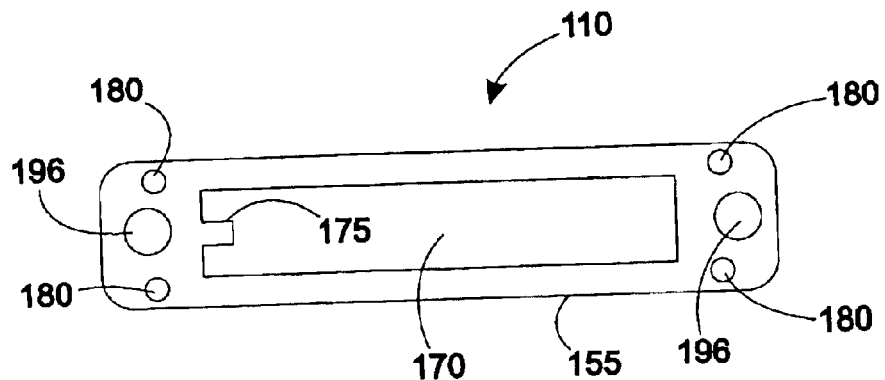
FIG. 3A is a drawing of a top view of the alignment/retention device of the representative embodiment of FIG. 1.

FIG. 3A is a drawing of a top view of the alignment/retention device 110 of the representative embodiment of FIG. 1. In the representative embodiment of FIG. 3A, the alignment/retention device 110 is shown with four alignment pins 180 molded into the housing 155 of the alignment/retention device 110 in the general vicinity of the four corners of the alignment/retention device 110 and surrounding the opening 170. Also shown are two threaded screw holes 196 (fastener parts 196) and the first key 175. In the representative embodiment of FIG. 3A, the first key 175 is shown as a protuberance extending into the opening 170. Other geometries for the first key 175 including, but not limited to, pins embedded into the housing 155.

Figure 3B:
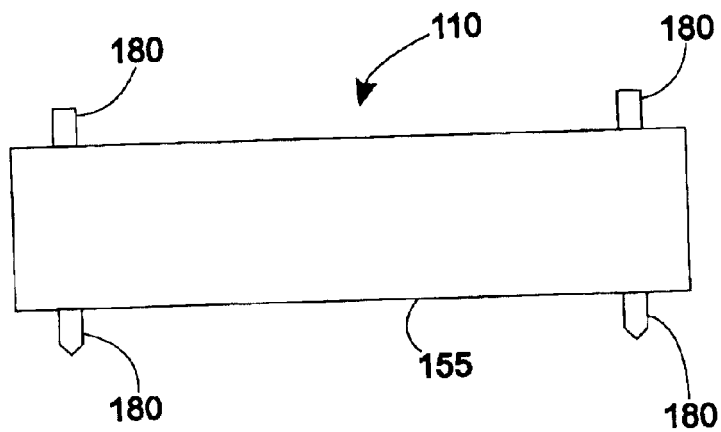
FIG. 3B is a drawing of a side view of the alignment/retention device of the representative embodiment of FIG. 3A.

FIG. 3B is a drawing of a side view of the alignment/retention device 110 of the representative embodiment of FIG. 3A. In the representative embodiment of FIG. 3B, the alignment/retention device 110 is shown with alignment pins 180 molded into the housing 155 of the alignment/retention device 110 in the general vicinity of the corners of the alignment/retention device 110.

Figure 3C:
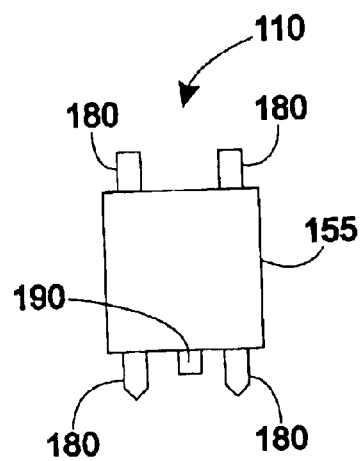
FIG. 3C is a drawing of an end view of the alignment/retention device of the representative embodiment of FIG. 3A.

FIG. 3C is a drawing of an end view of the alignment/retention device 110 of the representative embodiment of FIG. 3A. In the representative embodiment of FIG. 3C, the alignment/retention device 110 is shown with alignment pins 180 molded into the housing 155 of the alignment/retention device 110 in the general vicinity of the corners of the alignment/retention device 110.

Figure 3D:
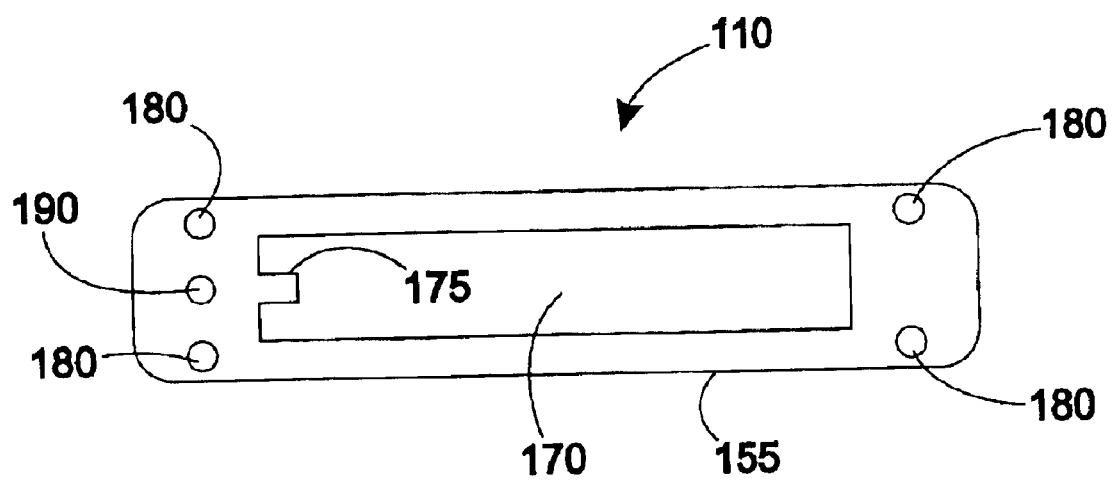
FIG. 3D is a drawing of a bottom view of the alignment/retention device of the representative embodiment of FIG. 3A.

FIG. 3D is a drawing of a bottom view of the alignment/retention device 110 of the representative embodiment of FIG. 3A. In the representative embodiment of FIG. 3D, the alignment/retention device 110 is shown with four alignment pins 180 molded into the housing 155 of the alignment/retention device 110 in the general vicinity of the four corners of the alignment/retention device 110 and surrounding the opening 170. Also shown is the first key 175. In the representative embodiment of FIG. 3D, the first key 175 is again shown as the protuberance extending into the opening 170. As stated above, other geometries for the first key 175 including, but not limited to, pins embedded into the housing 155.

Figure 4A:
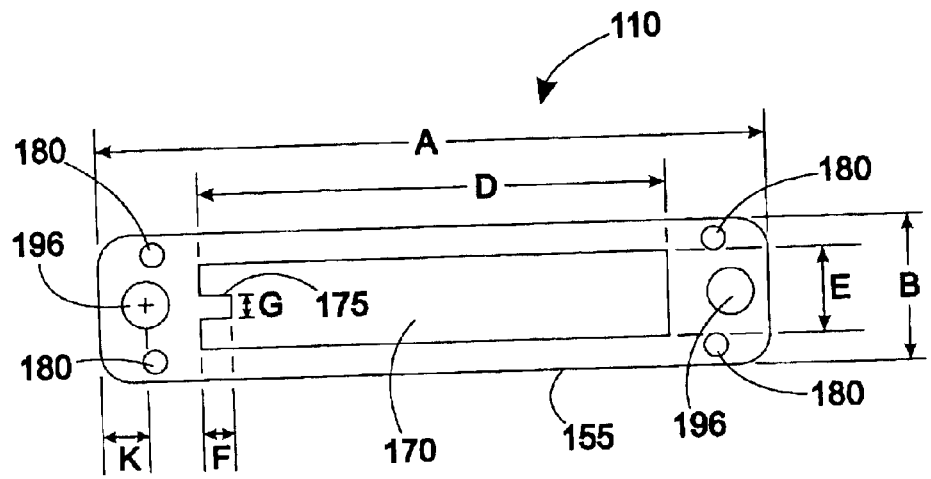
FIG. 4A is a drawing of a dimensioned top view of the alignment/retention device in the representative embodiment of FIG. 3A.
Figure 4B:
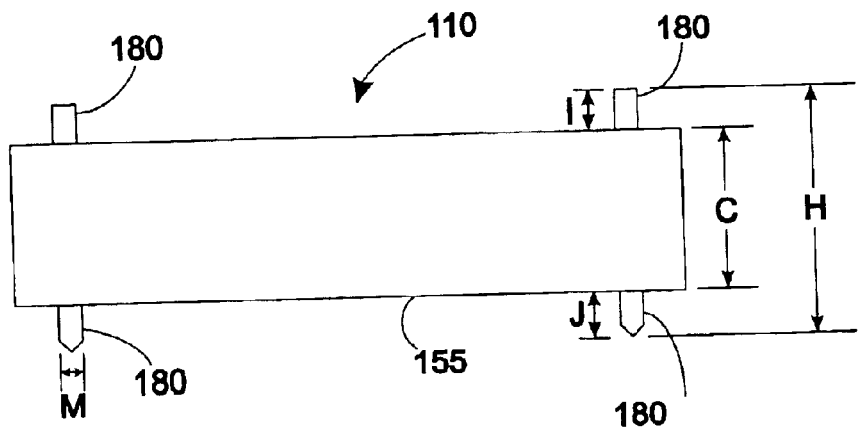
FIG. 4B is a drawing of a dimensioned side view of the alignment/retention device in the representative embodiment of FIG. 3A.
Figure 4C:
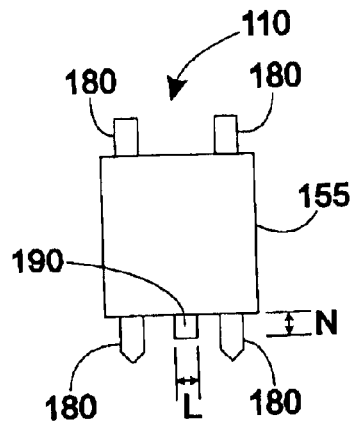
FIG. 4C is a drawing of a dimensioned end view of the alignment/retention device in the representative embodiment of FIG. 3A.

FIG. 4A is a drawing of a dimensioned top view of the alignment/retention device 110 in the representative embodiment of FIG. 3A. FIG. 4B is a drawing of a dimensioned side view of the alignment/retention device 110 in the representative embodiment of FIG. 3A. And, FIG. 4C is a drawing of a dimensioned end view of the alignment/retention device 110 in the representative embodiment of FIG. 3A.

In representative embodiments, dimensions of housing 155 are as follows: (1) length A=1.340", (2) width B=0.275", and height C=0.196". The opening 170 has representative dimensions of (1) length D=1.11" and (2) width E=0.219". The first key 175 has dimensions of (1) protrusion extent F=0.020" and (2) protrusion width G =0.076". The alignment pins 180 have representative dimensions of (1) length H=0.444" and diameter M=0.040". The alignment pins 180 extend a length I=0.141" above the first side 160 and a length J=0.107" below the second side 165.

In a representative embodiment, the fastener parts 196 are two threaded screw holes 196 that are drilled and tapped to accept number 1-64 screws. The screw holes 196 are typically centered laterally on the housing 155 a distance K=0.058" from each end of the housing 155. In representative embodiments, the housing 155 is a molded plastic with the alignment pins 180 being embedded into the housing 155 during the molding process.

The alignment pins are typically beryllium copper plated first with a thickness of 0.000050" nickel and then 0.000010" of gold and are heat treated. A chamfer of 0.070 "×0.020" is typically added to the alignment pins 180 as an aid in the alignment and insertion of the alignment pins 180 into the matching holes 185 on the electronic circuit assembly 120.

In a representative example, the second key 190 is an additional pin 190 having a diameter L=0.030" and extending a distance N=0.031" below the second side 165.

A recent development with which the alignment/retention device 110 can be uses is a probe system that comprises a semi-rigid support attached to a probing end of a probe. A spring pin and an isolation network are attached to the semi-rigid support. The semi-rigid support permits probing without the use of a mating connector. This so-called connector-less probe can be used to probe printed circuit boards and buses. Again, such a probe system is described in U.S. patent application Ser. No. 10/373,820, entitled "Connector-Less Probe" filed 25 Feb. 2003 by Brent A. Holcombe et al.

In representative embodiments, the alignment/retention device 110 provides the advantage of being able to accurately align the probe tips 145 of electronic probes 130 to matching test points 150 on electronic circuit assemblies 120 as, for example, printed circuit boards 120. Once aligned, alignment pins 180 on the alignment/retention device 110 can be soldered to the metalized test points 150 on the printed circuit board 120 which provides a mechanically stable environment for test. Once the test is completed, for ease of use and to minimize damage to the electronic circuit assembly 120 (the printed circuit board 120), the electronic probe 130 can be removed from the alignment/retention device 110 leaving the alignment/retention device 110 attached to the electronic circuit assembly 120 (the printed circuit board 120). Electronic disturbance of the electronic circuit assembly 120 following the test is thereby limited to only that caused by the test points 150.

While the present invention has been described in detail in relation to preferred embodiments thereof, the described embodiments have been presented by way of example and not by way of limitation. It will be understood by those skilled in the art that various changes may be made in the form and details of the described embodiments resulting in equivalent embodiments that remain within the scope of the appended claims.

What is claimed is:

1. A device, comprising:
    a housing having a first side and an opposing second side, wherein the housing comprises:
        an opening extending from the first side to the second side; and
        multiple alignment pins imbedded in the housing and extending external to both first and second sides, wherein on the first side the alignment pins are capable of insertion into matching holes on an electronic probe, and wherein on the second side the alignment pins are capable of insertion into matching holes on an electronic circuit assembly.

2. The device recited in claim 1, further comprising at least one fastener part capable of attaching the electronic probe to the housing.

3. The device as recited in claim 2, wherein the fastener part comprises a threaded screw hole into which a screw attached to the electronic probe can be inserted.

4. The device as recited in claim 1, wherein the at least one fastener part comprises two fastener parts.

5. The device as recited in claim 4, wherein the fastener parts each comprise a threaded screw hole into which a screw attached to the electronic probe can be inserted.

6. The device recited in claim 1, wherein the axis of each alignment pin is parallel to the axis of the opening.

7. The device recited in claim 1, wherein on the second side the alignment pins are capable of attachment to the electronic circuit assembly ffollowing their insertion into the electronic circuit assembly ttlehnatching holes.

8. The device as recited in claim 7, wherein attachment of the alignment pins to the electronic circuit assembly is effected by soldering the alignment pins into the electronic circuit assembly matching holes.

9. The device as recited in claim 1, wherein the electronic circuit assembly is a printed circuit board.

10. The device as recited in claim 1, wherein the multiple alignment pins comprise four aligrment pins.

11. A device comprising:
    a housing having a first side and an opposing second side, wherein the housing comprises:
        an opening extending from the first side to the second side: and
        multiple alignment pins imbedded in the housing and extending external to both first and second sides, wherein on the first side the aligunent pins are capable of insertion into matching holes on an electronic probe, and wherein on the second side the alignment pins are capable of insertion into matching holes on an electronic circuit assembly; and a first key, wherein when the first key is aligned with a matching geometry on the electronic probe, entry of the electronic probe into the opening is enabled, otherwise entry is prevented.

12. A device, comprising:

a housing having a first side and an opposing second side, wherein the housing comprises:

an opening extending from the first side to the second side; and multiple alignment pins imbedded in the housing and extending external to both first and second sides, wherein on the first side the alignment pins are capable of insertion into matching holes on an electronic probe, and wherein on the second side the alignment pins are capable of insertion into matching holes on an electronic circuit assembly; and a second key wherein when the second key is aligned with a matching geometry on the electronic circuit assembly, attachment of the device to the electronic circuit assembly is enabled, otherwise such entry is prevented.

13. The device as recited in claim 12, wherein the second key is an additional pin imbedded in the housing and extending external to the second side and wherein the matching geometry on the electronic circuit assembly is a hole into which the additional pin is capable of insertion.

14. The device as recited in claim 12, further comprising:

a first key, wherein when the first key is aligned with a matching geometry on the electronic probe, entry of the electronic probe into the opening is enabled, otherwise entry is prevented.

15. The device as recited in claim 14, further comprising at least one fastener part capable of attaching the electronic probe to the housing.

16. The device as recited in claim 15, wherein the fastener part comprises a threaded screw hole into which a screw attached to the electronic probe can be inserted.

17. The device recited in claim 14, wherein on the second side the alignment pins are capable of attachment to the electronic circuit assembly following their insertion into the electronic circuit assembly matching holes.

18. The device as recited in claim 17, wherein attachment of the alignment pins to the electronic circuit assembly is effected by soldering the alignment pins into the electronic circuit assembly matching holes.

19. The device as recited in claim 14, wherein the electronic circuit assembly is a printed circuit board.

20. The device recited in claim 14, wherein the multiple alignment pins comprise four alignment pins.

* * * * *

UNITED STATES PATENT AND TRADEMARK OFFICE
CERTIFICATE OF CORRECTION

PATENT NO. : 6,822,466 B1
DATED : November 23, 2004
INVENTOR(S) : Brent A. Holcombe and Brock J. LaMeres It is certified that error appears in the above-identified patent and that said Letters Patent is hereby corrected as shown below:

Column 6,
Line 46, after "assembly", delete "ffollowing" and insert therefor -- following --
Line 47, after "assembly", delete "ttlehnatching" and insert therefore -- matching --
Line 55, after "four", delete "aligrment" and insert therefor -- alignment --

Signed and Sealed this

Twenty-fourth Day of May, 2005

JON W. DUDAS
*Director of the United States Patent and Trademark Office*